US009947673B1

(12) United States Patent
Chang et al.

(10) Patent No.: US 9,947,673 B1
(45) Date of Patent: Apr. 17, 2018

(54) SEMICONDUCTOR MEMORY DEVICE

(71) Applicant: UNITED MICROELECTRONICS CORP., Hsin-Chu (TW)

(72) Inventors: Ting-Chia Chang, Chiayi (TW); Shih-Hao Liang, Tainan (TW); Chun-Yen Tseng, Tainan (TW); Yu-Tse Kuo, Tainan (TW); Ching-Cheng Lung, Tainan (TW); Hung-Chan Lin, Tainan (TW); Shao-Hui Wu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/479,253

(22) Filed: Apr. 4, 2017

(51) Int. Cl.
*H01L 27/02* (2006.01)
*H01L 27/11* (2006.01)
*G11C 11/412* (2006.01)
*H01L 29/24* (2006.01)

(52) U.S. Cl.
CPC ........ *H01L 27/1104* (2013.01); *G11C 11/412* (2013.01); *H01L 27/0207* (2013.01); *H01L 27/1116* (2013.01); *H01L 29/24* (2013.01)

(58) Field of Classification Search
CPC .. H01L 27/11; H01L 27/1104; H01L 27/0207; H01L 23/528; G11C 11/412
See application file for complete search history.

(56) References Cited

U.S. PATENT DOCUMENTS 9,245,593 B2  1/2016 Ishizu
9,385,713 B2  7/2016 Uesugi

2008/0042218 A1* 2/2008 Igarashi ............. G11C 11/412
                                                  257/391
2009/0065874 A1* 3/2009 Ishii ..................... G11O 5/063
                                                  257/393
2016/0284713 A1* 9/2016 Kihara ............... H01L 27/1108

OTHER PUBLICATIONS

Ishizu, Title of periodical: SRAM with C-Axis Aligned Crystalline Oxide Semiconductor: Power Leakage Reduction Technique for Microprocessor Caches, 2014.
Tamura, Title of IEEE:Embedded SRAM and Cortex-M0 Core with Backup Circuits Using a 60-nm Crystalline Oxide Semiconductor for Power Gating, 2014.
Tamura, Title of periodical: Embedded SRAM and Cortex-M0 Core Using a 60-NM Crystalline Oxide Semiconductor, 2014.

* cited by examiner

*Primary Examiner* — Jasmine Clark

(74) *Attorney, Agent, or Firm* — Winston Hsu

(57) ABSTRACT

The present invention provides a semiconductor memory device, includes at least one static random access memory (SRAM) cell, wherein the SRAM cell includes a first pick-up node, and a dielectric oxide SRAM (DOSRAM), disposed in a first dielectric layer and disposed above the SRAM cell when viewed in a cross section view, wherein the DOSRAM includes an oxide semiconductor filed effect transistor (OSFET) and a capacitor, a source of the OSFET is electrically connected to the first pick-up node of the SRAM cell through a via structure, and at least parts of the first dielectric layer are disposed between the source of the OSFET and the via structure, and the capacitor is disposed above the OSFET and electrically connected to a drain of the OSFET when viewed in the cross section view.

13 Claims, 4 Drawing Sheets

SEMICONDUCTOR MEMORY DEVICE

BACKGROUND OF THE INVENTION

1. Field of the Invention

The present invention relates to a semiconductor memory device, in particular, to a semiconductor memory device with a static random access memory (SRAM) connecting to a dielectric oxide SRAM (DOSRAM).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

In order to reduce the power consumption of a semiconductor device, circuits that do not need to operate are stopped by power gating or clock gating. A flip-flop (FF) is a sequential circuit (storage circuit that holds a state) included a lot in a semiconductor device. Thus, a reduction in power consumption of the FF leads to a reduction in power consumption of a semiconductor device including the FF. When a general FF is powered off, a state (data) held therein is lost.

By taking advantage of extremely low off-state current of a transistor whose semiconductor region is formed using an oxide semiconductor (hereinafter, such a transistor may be referred to as an OS transistor), a retention circuit capable of retaining data even when powered off has been proposed.

SUMMARY OF THE INVENTION

The present invention provides a semiconductor memory device, including a first bit line, a second bit line and a plurality of word lines, at least one static random access memory (SRAM) cell, wherein the SRAM cell comprises a first inverter including a first N-channel MOS transistor and a first P-channel MOS transistor, a second inverter including a second N-channel MOS transistor and a second P-channel MOS transistor with an input terminal of said second inverter being coupled to an output terminal of said first inverter and with an output terminal of said second inverter being coupled to an input terminal of said first inverter, a third N-channel MOS transistor having a source/drain path coupled between the output terminal of said first inverter and the first bit line, a first pick-up node defined between the source of the third N-channel MOS transistor and the output terminal of said first inverter, a fourth N-channel MOS transistor having a source/drain path coupled between the output terminal of said second inverter and the second bit line, a gate of each of said third and fourth N-channel MOS transistors being connected to one of said plurality of word lines, and a dielectric oxide SRAM (DOSRAM), disposed in a first dielectric layer and disposed above the SRAM cell when viewed in a cross section view, wherein the DOSRAM comprises an OSFET (oxide semiconductor field effect transistor) and a capacitor, a source of the OSFET is electrically connected to the first pick-up node of the SRAM cell through a via structure, and at least parts of the first dielectric layer are disposed between the source of the OSFET and the via structure, and the capacitor is disposed above the OSFET and electrically connected to a drain of the OSFET when viewed in the cross section view.

The present invention provides a memory device which includes a SRAM connecting to a DOSRAM, the data that is stored in the SRAM can be transferred into the DOSRAM, and afterwards, the SRAM can be turned off, thereby the power consumption of the memory device can be effectively reduced. By the applicant's experiment, after connecting the SRAM with a DOSRAM, the standby power of the memory device can be reduced from 2.9 µW to 0.003 µW. Besides, the contact structure that is electrically connected to the DOSRAM is a reverse J shaped structure, thereby decreasing the leakage current of the DOSRAM. Furthermore, in a preferred embodiment of the present invention, the DOSRAM is disposed right above the SRAM, therefore, each memory device has smaller occupied area, and the component density can be increased too.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
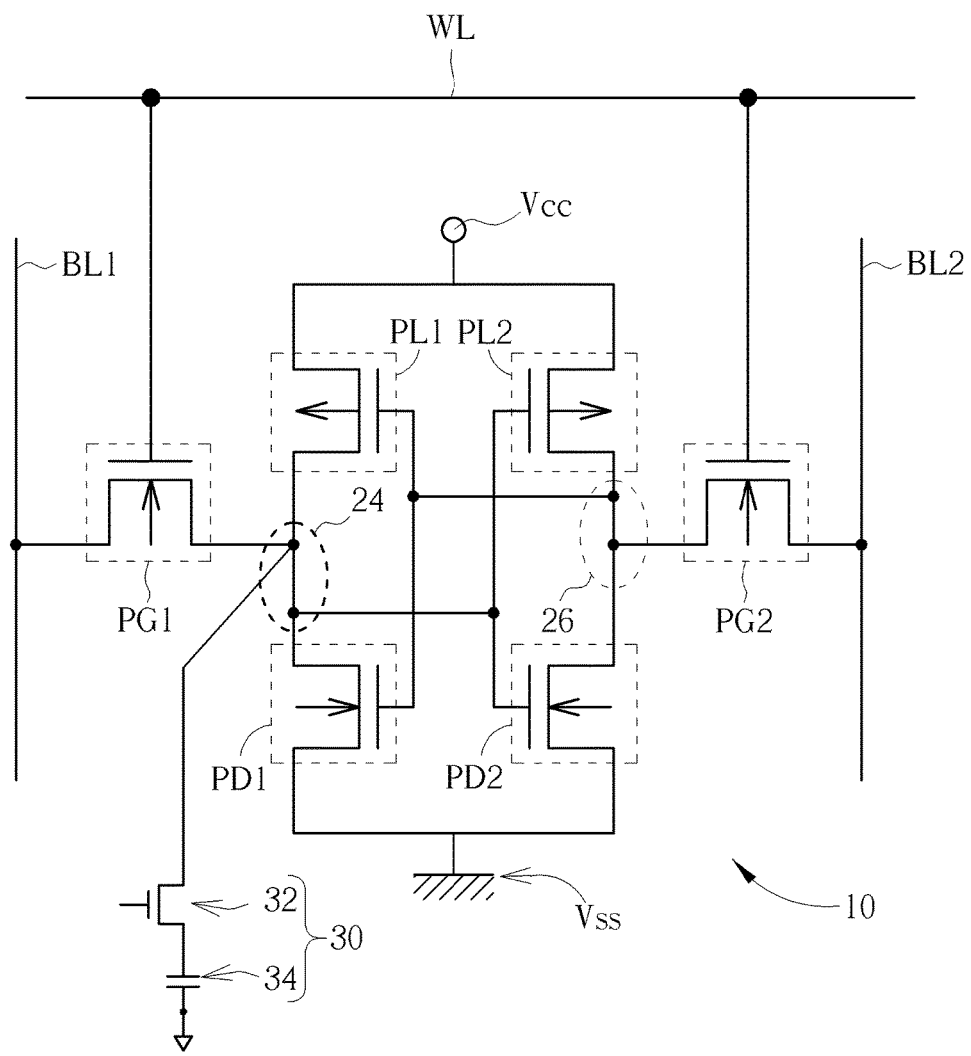
FIG. 1 illustrates a circuit diagram of a six-transistor SRAM (6T-SRAM) cell which is electrically connected to a dielectric oxide SRAM (DOSRAM) according to a first preferred embodiment of the present invention.

Referring to FIG. 1, FIG. 1 illustrates a circuit diagram of a six-transistor SRAM (6T-SRAM) cell which is electrically connected to a dielectric oxide SRAM (DOSRAM) according to a first preferred embodiment of the present invention.

As shown in FIG. 1, the SRAM device of the present invention preferably includes at least one SRAM cell, each SRAM cell such as including a six-transistor SRAM (6T-SRAM) cell 10. However, the present invention is not limited to 6T-SRAM, in other embodiments of the present invention, each SRAM may be an 8T-SRAM, 10T-SRAM or other suitable memory devices.

In this embodiment, each 6T-SRAM cell 10 is composed of a first pull-up transistor PL1, a second pull-up transistor PL2, a first pull-down transistor PD1, a second pull-down transistor PD2, a first access transistor PG1 and a second access transistor PG2. These six devices (transistors) constitute a set of flip-flops. The first and the second pull-up transistors PL1 and PL2, and the first and the second pull-down transistors PD1 and PD2 constitute a latch circuit that stores data in the storage nodes 24 and 26. Since the first and the second pull-up transistors PL1 and PL2 act as power load devices, they can be replaced by resistors. Under this circumstance, the static random access memory becomes a four-transistor SRAM (4T-SRAM). In this embodiment, the first and the second pull-up transistors PL1 and PL2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PL1 and PL2 of the 6T-SRAM cell 10 are composed of p-type metal oxide semiconductor (PMOS) transistors; the first and the second pull-down transistors PD1 and PD2, the first access transistors PG1 and the second access transistors PG2 composed of n-type metal oxide semiconductor (NMOS) transistors, but not limited thereto. The first pull-up transistor PL1 and the first pull-down transistor PD1 constitute an inverter, which further forma series circuit. One end of the series circuit is connected to a voltage source Vcc and the other end of the series circuit is connected to a voltage source Vss. Similarly, the second pull-up transistor PL2 and the second pull-down transistor PD2 constitute another inverter and a series circuit. One end of the series circuit is connected to the voltage source Vcc and the other end of the series circuit is connected to the voltage source Vss. The two inverters are cross-coupled to each other to store data.

The storage node 24 is connected to the respective gates of the second pull-down transistor PD2 and the second pull-up transistor PL2. The storage node 24 is also connected to the drains of the first pull-down transistor PD1, the first pull-up transistor PL1 and the first access transistor PG1. Similarly, the storage node 26 is connected to the respective gates of the first pull-down transistor PD1 and first the pull-up transistor PL1. The storage node 26 is also connected to the drains of the second pull-down transistor PD2, the second pull-up transistor PL2 and the second access transistor PG2. The gates of the first access transistor PG1 and the second access transistor PG2 are respectively coupled to a word line (WL); the source of the first access transistor PG1 and the second access transistor PG2 are respectively coupled to a first bit line (BL1) and a second bit line (BL2).

Besides, in the present invention, the 6T-SRAM cell 10 is electrically connected to at least one dielectric oxide SRAM (hereinafter referred to as DOSRAM) 30, which consists of an oxide semiconductor field effect transistor (hereinafter referred to as OSFET) 32 and a capacitor 34. The purpose of connecting the 6T-SRAM 10 cell with the DOSRAM 30 is that the storage data (0 or 1) in the storage node 24 or 26 of the 6T-SRAM cell 10 can be transferred and stored from the 6T-SRAM cell 10 to the DOSRAM 30. The feature of the DOSRAM 30 is that the OSFET of the DOSRAM 30 includes an oxide semiconductor layer, and the standby power of the DOSRAM is very low, so when the data is stored in the DOSRAM 30, the SRAM (such as the 6T-SRAM cell 10) can be turned off, and the power consumption of the whole device can be effectively reduced.

In addition, in one embodiment of the present invention, both the storage node 24 and storage node 26 are electrically connected to a DOSRAM respectively. Therefore, the values that are stored in the storage node 24 and storage node 26 can be transferred to two DOSRAMs. However, the values that are stored in the storage node 24 and storage node 26 are complementary to each other (for example, if the value stored in the storage node 24 is 0, the value stored in the storage node 26 must be 1, and vice versa). Therefore, in another embodiment of the present invention, only one DOSRAM is needed to connect the storage node 24 (or the storage node 26), and the value that is stored in another storage node can still be known. In the following paragraph, the DOSRAM 30 is electrically connected to the storage node 24 of the 6T-SRAM cell 10 as an example.

Figure 2:
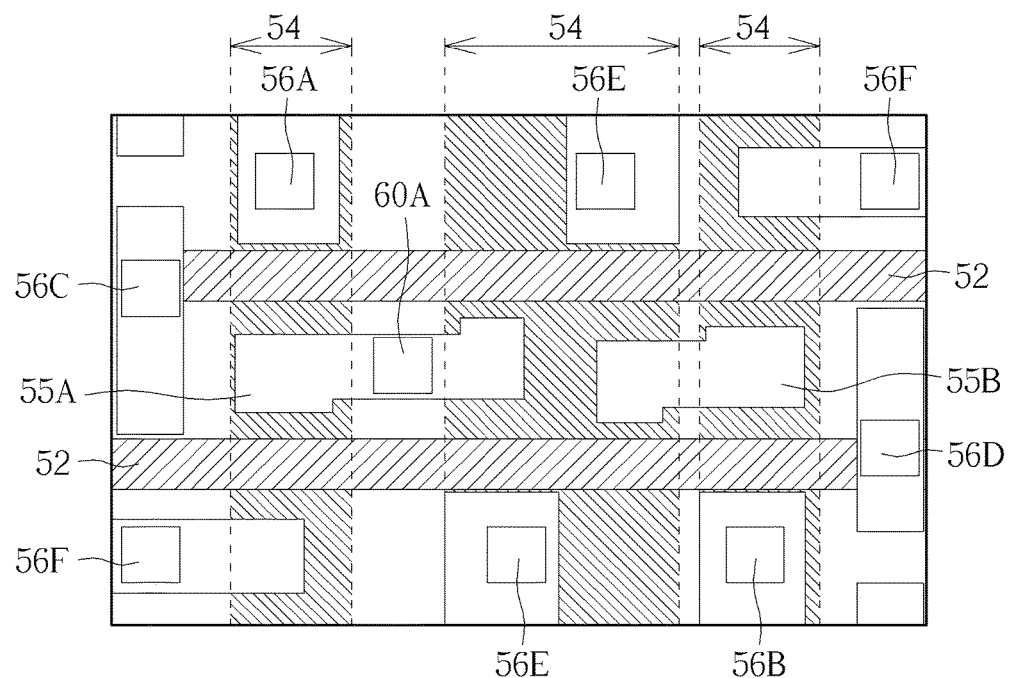
FIG. 2 illustrates a layout diagram of a 6T-SRAM according to a first preferred embodiment of the present invention.

FIG. 2 illustrates a layout diagram of a 6T-SRAM cell 10 according to the first preferred embodiment of the present invention, as shown in FIG. 2, each 6T-SRAM cell 10 includes a plurality of gate lines 52 and a plurality of diffusion regions 54 crossed to each other, and the extending direction of each gate line 52 and the extending direction of each diffusion region 54 are preferably perpendicular to each other. Besides, the portion that the gate lines 52 and the diffusion regions 54 compose a plurality of transistors, which includes the first pull-up transistor PL1, the second pull-up transistor PL2, the first pull-down transistor PD1, the second pull-down transistor PD2, the first access transistor PG1 and the second access transistor PG2 mentioned above, and these transistors are labeled on FIG. 2.

Besides, the 6T-SRAM cell 10 comprises a plurality of metal layers 55, disposed on the diffusion regions 54. And in particular, the metal layers 55 include one first metal layer 55A and one first metal layer 55B disposed between two gate lines 52. The position of the first metal layer 55A corresponds to the storage node 24 shown in FIG. 1, electrically connected to the gate of the second pull-up transistor PL2, the gate of the second pull-down transistor PD2, the drain of the first pull-up transistor PL1, and the drain of the first access transistor PG1. On the other hand, the first metal layer 55B corresponds to the storage node 26 shown in FIG. 1, electrically connected to the gate of the first pull-up transistor PL1, the gate of the first pull-down transistor PD1, the drain of the second pull-up transistor PL2, and the drain of the second access transistor PG2.

Furthermore, each 6T-SRAM cell 10 comprises a plurality of contact structures 56 disposed on the metal layers 55, the contact structures 56 including: contact structures 56A, 56B, 56C, 56D, 56E and 56F to electrically connect different elements. For example, the contact structure 56A is electrically connected to the first access transistor PG1 and the first bit line BL1; the contact structure 56B is electrically connected to the second access transistor PG2 and the second bit line BL; the contact structure 56C is electrically connected to one of the word line WL and a gate of the first access transistor PG1; the contact structure 56D is electrically connected to one of the word line WL and a gate of the second access transistor PG2; the contact structure 56E is electrically connected to the voltage source Vcc and the first pull-up transistor PL1 (or electrically connected the voltage source Vcc and the second pull-up transistor PL2); and the contact structure 56F is electrically connected to the voltage source Vss and the first pull-down transistor PD1 (or electrically connected the voltage source Vss and the second pull-down transistor PD2).

In addition, a pick-up contact plug 60A is formed and disposed on the first metal layer 55A. The pick-up contact plug 60A is used to electrically connect the 6T-SRAM cell 10 and the DOSRAM 30. In this embodiment, since there is only one DOSRAM 30 that is electrically connected to the 6T-SRAM cell 10, only one pick-up contact plug 60A is included. However, in another embodiment, if there are two DOSRAMs electrically connected to the 6T-SRAM cell 10, another pick-up contact plug (not shown) can be formed on the first metal layer 55B. It should also be within the scope of the present invention.

Figure 3:
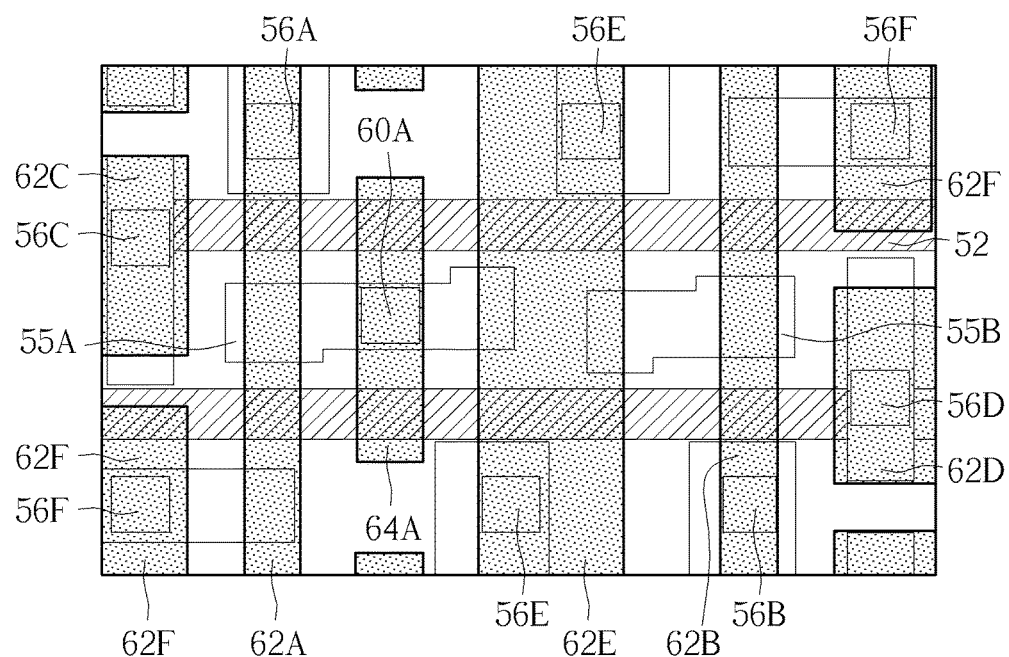
FIGS. 3-4 illustrate layout diagrams of a 6T-SRAM after forming a plurality of metal lines.

Afterwards, as shown in FIG. 3, FIG. 3 illustrates a layout diagram of a 6T-SRAM cell 10 according to the first preferred embodiment of the present invention. A plurality of metal lines are formed, electrically connected to the contact structures 56 (including the contact structures 56A, 56B, 56C, 56D, 56E, 56F) and the pick-up contact plug 60A. The plurality of metal lines including: the first BL metal line 62A, which is electrically connected to the first bit line BL1 and the contact structure 56A; the second BL metal line 62B, which is electrically connected to the second bit line BL2 and the contact structure 56B; the WL metal line 62C, which is electrically connected to the word line WL and the contact structure 56C; the WL metal line 62D, which is electrically connected to the word line WL and the contact structure 56D; the Vcc metal line 62E, which is electrically connected to the voltage source Vcc and the contact structures 56E; and the Vss metal line 62F, which is electrically connected to the voltage source Vss and the contact structures 56F. In addition, the 6T-SRAM cell 10 furthermore comprises a pick-up metal line 64A, disposed between the first BL metal line 62A and the Vcc metal line 62E, and the pick-up metal line 64A is electrically connected to the pick-up contact plug 60A.

One feature of the present invention is when viewed in a plane view (such as FIG. 3), the extending direction of the pick-up metal line 64A, the first BL metal line 62A and the Vcc metal line 62E are parallel to each other. In this way, the pick-up metal line 64A can be formed disposed between the first BL metal line 62A and the Vcc metal line 62E. Compared with the conventional 6T-SRAM layout without forming the pick-up contact plug 60A and the pick-up metal line 64A, the present invention requires only a little more area to accommodate the pick-up contact plug 60A and the pick-up metal line 64A.

Figure 4:
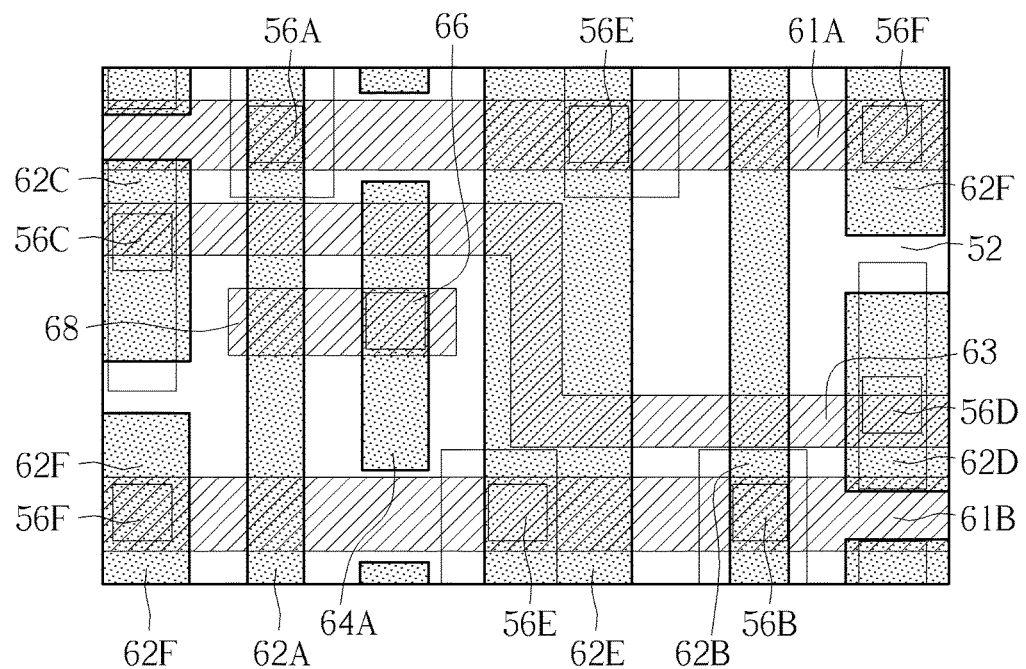

Afterwards, as shown in FIG. 4, a plurality of metal lines are further formed, electrically connected to the pick-up metal line 64A and other contact structures. In addition, the word line 63 can also be formed in this layer, but not limited thereto. For example, the metal line 61A (or the metal line 61B) is electrically connected the Vss metal line 62F and the voltage source Vss; the metal line 68 is electrically connected to the pick-up metal line 64A through a pick-up contact plug 66. It is noteworthy that compared with conventional SRAM structure, the present invention further comprises the pick-up metal line 68. In order to accommodate the additional pick-up metal line 68, while remaining the same device area, or to further decrease the device area, in the present invention, the word line 63 is designed as a "step-height shaped structure" when viewed in the top view. The step-height shaped word line 63 partially surrounds the metal line 68, but does not contact the pick-up metal line 68 directly. For example, the upper side and the right side of the metal line 68 is surrounded by the word line 63. Since the step-height shaped word line 63 and the pick-up metal line 68 do not contact to each other, they can be formed in a same dielectric layer, and the SRAM area can be decreased too.

Figure 5:
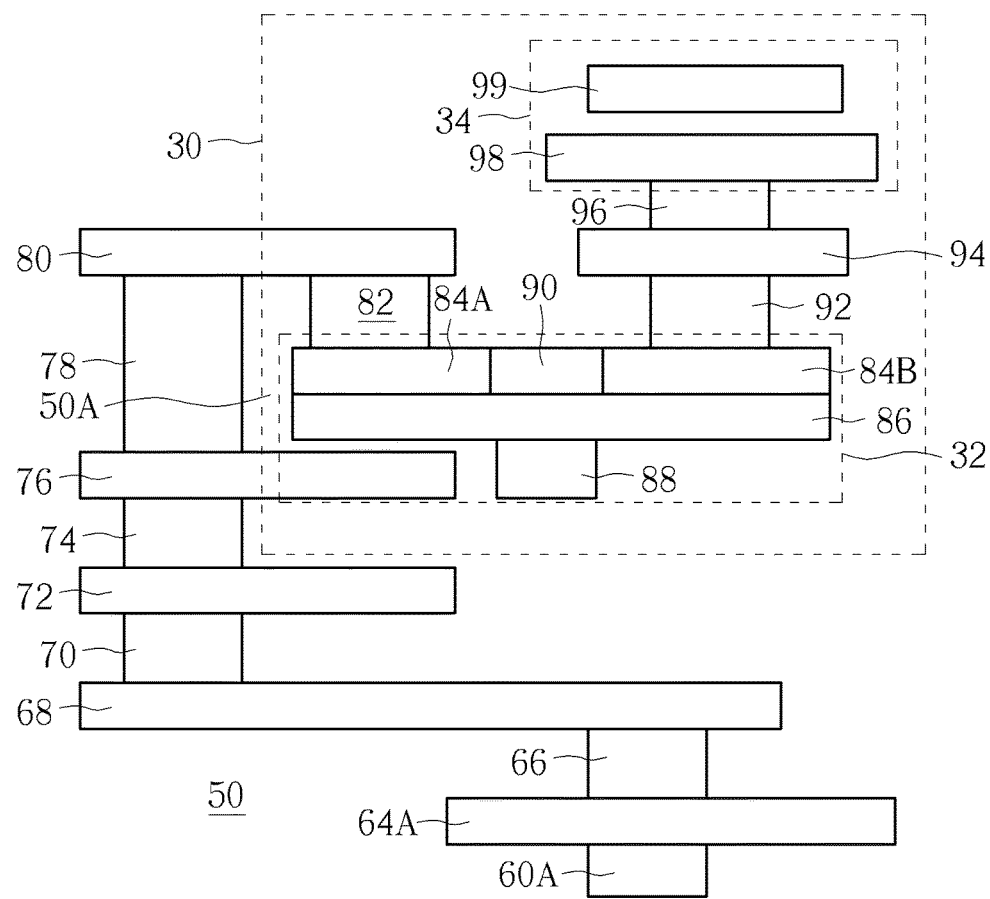
FIG. 5 illustrates a cross section diagram showing a SRAM connecting to a DOSRAM.

FIG. 5 illustrates a cross section diagram showing a SRAM connecting to a DOSRAM 30. In order to simplify the figure, FIG. 5 only shows parts of the SRAM, especially the pick-up contact plug 60A and the pick-up metal line 64A, and other elements of the SRAM are omitted. The SRAM mentioned here can be the 6T-SRAM cell 10 shown in FIGS. 1-4, or other suitable SRAM devices like an 8T-SRAM cell. As shown in FIG. 5, the DOSRAM 30 is formed above and electrically connected to the SRAM (electrically connected to the pick-up contact plug 60A) through a plurality of via structures (such as the via structures 66, 70, 74, 78 and 82 shown in FIG. 4) and plurality of metal lines (such as metal lines 68, 72, 76 and 80). Preferably, the DOSRAM 30 is disposed right above the SRAM. In other words, when viewed in a top view, parts of the DOSRAM 30 and the SRAM are overlapped with each other, thereby decreasing the area of the memory device. Besides, the DOSRAM 30, the SRAM, the via structures and the metal lines are formed in a dielectric layer 50. The dielectric layer 50 may be a multiple layer structure. However, in order to simplify the figure, all of the dielectric layers are labeled as a single dielectric layer 50 shown in FIG. 5.

The DOSRAM 30 includes the OSFET 32 and the capacitor 34. The OSFET 32 comprising: a bottom gate 88, a top gate 90, an oxide semiconductor layer 86 disposed between the bottom gate 88 and the top gate 90, and two source/drain regions 84A, 84B disposed on two sides of the top gate 90. In this embodiment, the oxide semiconductor layer such as an indium gallium zinc oxide (IGZO) layer. The source/drain region 84A is electrically connected to the SRAM.

Another feature of the present invention is that the contact structure (including the via structures and the metal lines) that is electrically connected to the OSFET 32 is a "reverse J" shaped structure. More precisely, the via structure 82 electrically connected to and directly contacting a top surface of the source/drain region 84A of the OSFET 32, and the via structures 78, 82 and the metal line 80 that is near the source/drain region 84A compose a "reverse J" shaped structure when viewed in the cross section view. In other words, the via structure 78 that is near the OSFET 32 does not contact the source/drain region 84A directly, and parts of the dielectric layer (such as the dielectric layer 50A labeled in FIG. 4) are disposed between the source/drain region 84A and the via structure 78. Besides, when viewed in the cross section view of the present invention, the metal line 80 is disposed above the source/drain region 84A. In this way, since only the top surface of the source/drain region 84A is contacted by the via structure 82, the sidewall of the source/drain region 84A is covered by the dielectric layer 50A, and the leakage current of the OSFET 32 can be decreased. In addition, in one embodiment of the present invention, the metal line 76 is disposed below the source/drain region 84A, and when viewed in a top view (not shown), the metal line 76 and the metal line 80 are preferably overlapped with each other.

Another source/drain region 84B of the OSFET 32 is electrically to the capacitor 34 through a plurality of via structures (such as the via structures 92, 96) and one metal line 94. In another embodiment of the present invention, some metal lines or some via structures can be omitted. The capacitor 34 includes a bottom plate 98 and a top plate 99. Preferably, an area of the bottom plate 98 is larger than an area of the top plate 99, but not limited thereto. Other features about the OSFET and the capacitor which are not mentioned here are well known to persons of ordinary skills in the art and the details will not be described here.

In summary, the present invention provides a memory device which includes a SRAM connecting to a DOSRAM, and the data that is stored in the SRAM can be transferred into the DOSRAM. Afterwards, the SRAM can be turned off, thereby the power consumption of the memory device can be effectively reduced. By the applicant's experiment, after connecting the SRAM with a DOSRAM, the standby power of the memory device can be reduced from 2.9 μW to 0.003 μW. Besides, the contact structure that is electrically connected to the DOSRAM is a reverse J shaped structure, thereby decreasing the leakage current of the DOSRAM. Furthermore, in a preferred embodiment of the present invention, the DOSRAM is disposed right above the SRAM, therefore, each memory device has smaller occupied area, and the component density can be increased too.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a first bit line, a second bit line and a word line;
a static random access memory (SRAM) cell, wherein the SRAM cell comprises a first inverter including a first N-channel MOS transistor and a first P-channel MOS transistor, a second inverter including a second N-channel MOS transistor and a second P-channel MOS transistor with an input terminal of said second inverter being coupled to an output terminal of said first inverter and with an output terminal of said second inverter being coupled to an input terminal of said first inverter, a third N-channel MOS transistor having a source/drain path coupled between the output terminal of said first inverter and the first bit line, a first pick-up node defined between the source of the third N-channel MOS transistor and the output terminal of said first inverter, a fourth N-channel MOS transistor having a source/drain path coupled between the output terminal of said second inverter and the second bit line, a gate of each of said third and fourth N-channel MOS transistors being connected to the word line; and
a dielectric oxide SRAM (DOSRAM), disposed in a first dielectric layer and disposed above the SRAM cell, wherein the DOSRAM comprises an oxide semiconductor field effect transistor (OSFET) and a capacitor, a source of the OSFET is electrically connected to the first pick-up node of the SRAM cell through a via structure, and at least parts of the first dielectric layer are disposed between the source of the OSFET and the via structure, and the capacitor is disposed above the OSFET and electrically connected to a drain of the OSFET.

2. The semiconductor memory device of claim 1, wherein the SRAM cell further comprises:
at least one pick-up line, electrically connected to the first pick-up node via a first pick-up contact.

3. The semiconductor memory device of claim 2, wherein the first pick-up line, the first bit line and the second bit line are disposed in a same dielectric layer.

4. The semiconductor memory device of claim 2, wherein the first pick-up line is disposed between the first bit line and a Vcc metal line which is electrically connected to a voltage source.

5. The semiconductor memory device of claim 2, further comprising a second pick-up line disposed above the first pick-up line, and which is electrically connected to the first pick-up line.

6. The semiconductor memory device of claim 5, wherein the word line is a step-height shaped structure, the word line and the second pick-up line are disposed in a same dielectric layer, and the second pick-up line is partially surrounded by the word line.

7. The semiconductor memory device of claim 1, wherein the OSFET comprises:
a bottom gate structure;
a top gate structure; and
an oxide semiconductor layer disposed between the bottom gate structure and the top gate structure.

8. The semiconductor memory device of claim 7, wherein the oxide semiconductor layer of the OSFET comprises an indium gallium zinc oxide (IGZO) layer.

9. The semiconductor memory device of claim 1, wherein the via structure comprises:
a first via structure, electrically connected to the SRAM cell and the OSFET, and the first via structure does not contact the OSFET directly;
a second via structure, electrically connected to the SRAM cell and the OSFET, and the second via structure contacts the source of the OSFET directly; and
a metal line, disposed between and electrically connected to the first via structure and the second via structure.

10. The semiconductor memory device of claim 9, wherein the first via structure, the second via structure and the OSFET are formed in a same dielectric layer.

11. The semiconductor memory device of claim 9, wherein the metal line is disposed above the OSFET.

12. The semiconductor memory device of claim 9, wherein parts of the first dielectric layer are disposed between the source of the OSFET and the first via structure.

13. The semiconductor memory device of claim 1, wherein the capacitor comprises a bottom plate and a top plate, and an area of the bottom plate is larger than an area of the top plate.

* * * * *